(12) United States Patent
Park et al.

(10) Patent No.: US 12,356,786 B2
(45) Date of Patent: Jul. 8, 2025

(54) IMAGING SENSOR AND DISPLAY DEVICE INCLUDING THE SAME

(71) Applicants: Samsung Electronics Co., Ltd., Suwon-si (KR); UNIVERSITY OF THE RYUKYUS, Okinawa (JP)

(72) Inventors: Kyung Bae Park, Hwaseong-si (KR); Hiroshi Kageyama, Nishihara (JP); Akira Higa, Nishihara (JP); Takashi Noguchi, Nishihara (JP)

(73) Assignees: Samsung Electronics Co., Ltd., Gyeonggi-do (KR); University of the Ryukyus, Okinawa (JP)

( * ) Notice: Subject to any disclaimer, the term of this patent is extended or adjusted under 35 U.S.C. 154(b) by 45 days.

(21) Appl. No.: 17/727,059

(22) Filed: Apr. 22, 2022

(65) Prior Publication Data

US 2022/0344416 A1    Oct. 27, 2022

(30) Foreign Application Priority Data

Apr. 23, 2021  (KR) .......................... 10-2021-0053188

(51) Int. Cl.
*H10K 39/34* (2023.01)
*H10K 39/32* (2023.01)
*H10K 59/65* (2023.01)

(52) U.S. Cl.
CPC ............. *H10K 39/32* (2023.02); *H10K 39/34* (2023.02); *H10K 59/65* (2023.02)

(58) Field of Classification Search
CPC ........ H10K 59/65; H10K 39/32; H10K 39/34; H01L 27/14612; H01L 27/1461;
(Continued)

(56) References Cited

U.S. PATENT DOCUMENTS

| 2011/0108836 A1* | 5/2011 | Koyama | ........... H01L 27/14627 257/E29.095 |
| 2013/0049082 A1* | 2/2013 | Kato | ................. H01L 27/14603 257/292 |

(Continued)

FOREIGN PATENT DOCUMENTS

| CN | 110245649 A  * | 9/2019 | ........... G06K 9/0004 |
| CN | 111128874 A | 5/2020 | |

(Continued)

OTHER PUBLICATIONS

Korean Office Action dated Apr. 15, 2025 for corresponding Korean Application No. 10-2021-0053188, and corresponding English-language translation.

(Continued)

*Primary Examiner* — Temesghen Ghebretinsae
*Assistant Examiner* — Karin Kiyabu
(74) *Attorney, Agent, or Firm* — HARNESS, DICKEY & PIERCE, P.L.C.

(57) ABSTRACT

An imaging sensor includes a photoelectric conversion element, and a plurality of transistors connected to the photoelectric conversion element. The plurality of transistors are configured to transmit charges generated by the photoelectric conversion element. The plurality of transistors includes at least one transistor that includes a silicon semiconductor layer and at least one other transistor that includes an oxide semiconductor layer.

8 Claims, 11 Drawing Sheets

(58) Field of Classification Search
CPC ........... H01L 27/14636; H10F 39/8033; H10F 39/811; H10F 39/8037
See application file for complete search history.

(56) References Cited

U.S. PATENT DOCUMENTS

| | | | |
|---|---|---|---|
| 2016/0056200 A1* | 2/2016 | Lee .................... | H01L 27/1464 257/292 |
| 2018/0089491 A1* | 3/2018 | Kim ....................... | G06V 40/67 |
| 2018/0211085 A1* | 7/2018 | Liu ....................... | G06F 3/0412 |
| 2018/0357460 A1* | 12/2018 | Smith .................... | H10K 59/40 |
| 2019/0096330 A1* | 3/2019 | Kim ..................... | G09G 3/3266 |
| 2019/0226920 A1 | 7/2019 | Zhao et al. | |
| 2019/0340409 A1* | 11/2019 | Zhu ........................ | H10K 59/35 |
| 2020/0104562 A1* | 4/2020 | Sung ................. | H01L 27/14605 |
| 2021/0408140 A1* | 12/2021 | Han ...................... | H10K 59/65 |
| 2022/0037418 A1* | 2/2022 | Han .................... | H10K 59/353 |

FOREIGN PATENT DOCUMENTS

| | | | |
|---|---|---|---|
| KR | 10-2012-0091294 A | 8/2012 | |
| KR | 10-2013-0021330 A | 3/2013 | |
| KR | 10-2019-0035609 A | 4/2019 | |
| KR | 2020-0025740 A | 3/2020 | |
| KR | 2020-0025831 A | 3/2020 | |

OTHER PUBLICATIONS

Kamada, Taisuke, et al. "OLED display incorporating organic photodiodes for fingerprint imaging." Journal of the Society for Information Display 27.6 (2019): 361-371.

* cited by examiner

IMAGING SENSOR AND DISPLAY DEVICE INCLUDING THE SAME

CROSS-REFERENCE TO RELATED APPLICATION

This application claims priority to and the benefit of Korean Patent Application No. 10-2021-0053188 filed in the Korean Intellectual Property Office on Apr. 23, 2021, the entire contents of which are incorporated herein by reference.

BACKGROUND

(a) Field

The present inventive concepts relate to imaging sensors and display devices including the same.

(b) Description of the Related Art

An image sensor is a semiconductor device for converting optical images into electrical signals. The image sensor is used in electronic devices for general consumers, such as digital cameras, cell phone cameras, and portable camcorders, and also in cameras installed in vehicles, security devices, and robots. The image sensor includes a pixel array, and pixels included in the pixel array may respectively include an optical sensing element. The optical sensing element may generate electrical signals according to intensity of absorbed light.

SUMMARY

Some example embodiments of the present inventive concepts provide an imaging sensor and/or display device configured to provide improved accuracy of sensing electrical signals generated by an optical sensing element of the imaging sensor and/or display device.

Some example embodiments of the present inventive concepts provide a display device including an image sensor, where the display device has a reduced or minimized thickness.

Some example embodiments of the present inventive concepts provide an imaging sensor that may include a photoelectric conversion element and a plurality of transistors connected to the photoelectric conversion element. The plurality of transistor may be configured to transmit charges generated by the photoelectric conversion element. The plurality of transistors may include at least one transistor that includes a silicon semiconductor layer and at least one other transistor that includes an oxide semiconductor layer.

The photoelectric conversion element may include an organic photodiode, the plurality of transistors may include a first transistor including a gate connected to a cathode of the organic photodiode, a drain connected to a first driving voltage line, and a source electrically connected a readout line, a second transistor including a gate connected to a selection signal line, a drain connected to the source of the first transistor, and a source connected to the readout line, and a third transistor including a gate connected to a reset signal line, a drain connected to the first driving voltage line, and a source connected to a cathode of the organic photodiode, and the gate of the first transistor may be configured to be reset in response to the third transistor being turned on.

The third transistor may include the oxide semiconductor layer.

The first transistor may include the silicon semiconductor layer.

The photoelectric conversion element may be an organic photodiode, the plurality of transistors may include: a first transistor including a gate connected to a cathode of the organic photodiode, a drain connected to a first driving voltage line, and a source electrically connected a readout line; a second transistor including a gate connected to a selection signal line, a drain connected to the source of the first transistor, and a source connected to the readout line; a third transistor including a gate connected to a reset signal line, a drain connected to the first driving voltage line, and a source electrically connected to a cathode of the organic photodiode; and a fourth transistor including a gate connected to a transmitting signal line, a drain connected to the gate of the first transistor, and a source connected to the cathode of the organic photodiode, and the gate of the first transistor may be configured to be reset in response to the third transistor being turned on.

The third transistor may include the oxide semiconductor layer.

The first transistor may include the silicon semiconductor layer.

Some example embodiments of the present inventive concepts provides a display device that may include: a display unit including a plurality of display pixels and a plurality of sensor pixels; a plurality of drivers configured to apply signals to drive the display pixels and the sensor pixels; and a signal controller configured to control the driver, wherein each separate pixel of the display pixels and the sensor pixels may include a separate plurality of transistors, and each separate plurality of transistors may include at least one transistor that includes a silicon semiconductor layer and at least one other transistor that includes an oxide semiconductor layer.

The plurality of sensor pixels may further include separate, respective organic photodiodes, the separate plurality of transistors included in each separate sensor pixel of the plurality of sensor pixels may include: a first transistor including a gate connected to a cathode of the organic photodiode of the separate sensor pixel, a drain connected to a first driving voltage line, and a source electrically connected to a readout line; a second transistor including a gate connected to a selection signal line, a drain connected to the source of the first transistor, and a source connected to the readout line; and a third transistor including a gate connected to a reset signal line, a drain connected to the first driving voltage line, and a source connected to the cathode of the organic photodiode of the separate sensor pixel, and the gate of the first transistor may be configured to be reset in response to the third transistor being turned on.

The third transistor may include the oxide semiconductor layer.

The first transistor may include the silicon semiconductor layer.

The plurality of sensor pixels may further include separate, respective organic photodiodes, the separate plurality of transistors included in each separate sensor pixel of the plurality of sensor pixels may include: a first transistor including a gate connected to a cathode of the organic photodiode of the separate sensor pixel, a drain connected to a first driving voltage line, and a source electrically connected to a readout line; a second transistor including a gate connected to a selection signal line, a drain connected to the source of the first transistor, and a source connected to the readout line; a third transistor including a gate connected to a reset signal line, a drain connected to the first driving voltage line, and a source electrically connected to the cathode of the organic photodiode of the separate sensor pixel; and a fourth transistor including a gate connected to a transmitting signal line, a drain connected to the gate of the first transistor, and a source connected to the cathode of the organic photodiode of the separate sensor pixel, and the gate of the first transistor may be configured to be reset in response to the third transistor being turned on.

The third transistor may include the oxide semiconductor layer.

The first transistor may include the silicon semiconductor layer.

Each sensor pixel of the plurality of sensor pixels may further include a separate plurality of organic photodiodes configured to convert incident light with different wavelengths into electrical signals, the separate plurality of transistors included in each separate sensor pixel of the plurality of sensor pixels may include: a first transistor including a gate connected to respective cathodes of the separate plurality of organic photodiodes of the separate sensor pixel, a drain connected to a first driving voltage line, and a source electrically connected to a readout line; a second transistor including a gate connected to a selection signal line, a drain connected to the source of the first transistor, and a source connected to the readout line; a third transistor including a gate connected to a reset signal line, a drain connected to the first driving voltage line, and a source electrically connected to the respective cathodes of the separate plurality of organic photodiodes of the separate sensor pixel; a fourth-1 transistor including a gate connected to a first transmitting signal line, a drain connected to the gate of the first transistor, and a source connected to a cathode of a first organic photodiode of the separate plurality of organic photodiodes of the separate sensor pixel; a fourth-2 transistor including a gate connected to the first transmitting signal line, a drain connected to the gate of the first transistor, and a source connected to a cathode of a second organic photodiode of the separate plurality of organic photodiodes of the separate sensor pixel; and a fourth-3 transistor including a gate connected to the first transmitting signal line, a drain connected to the gate of the first transistor, and a source connected to a cathode of a third organic photodiode of the separate plurality of organic photodiodes of the separate sensor pixel, and the gate of the first transistor may be configured to be reset in response to the third transistor being turned on.

The third transistor may include the oxide semiconductor layer.

The first transistor may include the silicon semiconductor layer.

The plurality of sensor pixels and the plurality of display pixels may be arranged in a pattern in the display unit, and a ratio of the plurality of sensor pixels vs. the plurality of display pixels in the display unit may be 1:1 to 1:2.

One sensor pixel may be between two adjacent display pixels in the display unit, and a first direction distance in a first direction between the two adjacent display pixels and through the one sensor pixel therebetween may be less than a first direction length of one display pixel of the two adjacent display pixels in the first direction.

According to some example embodiments, high-quality image signals may be obtained as a merit.

According to some example embodiments, the thin display device may be provided as a merit.

DETAILED DESCRIPTION

Figure 1:
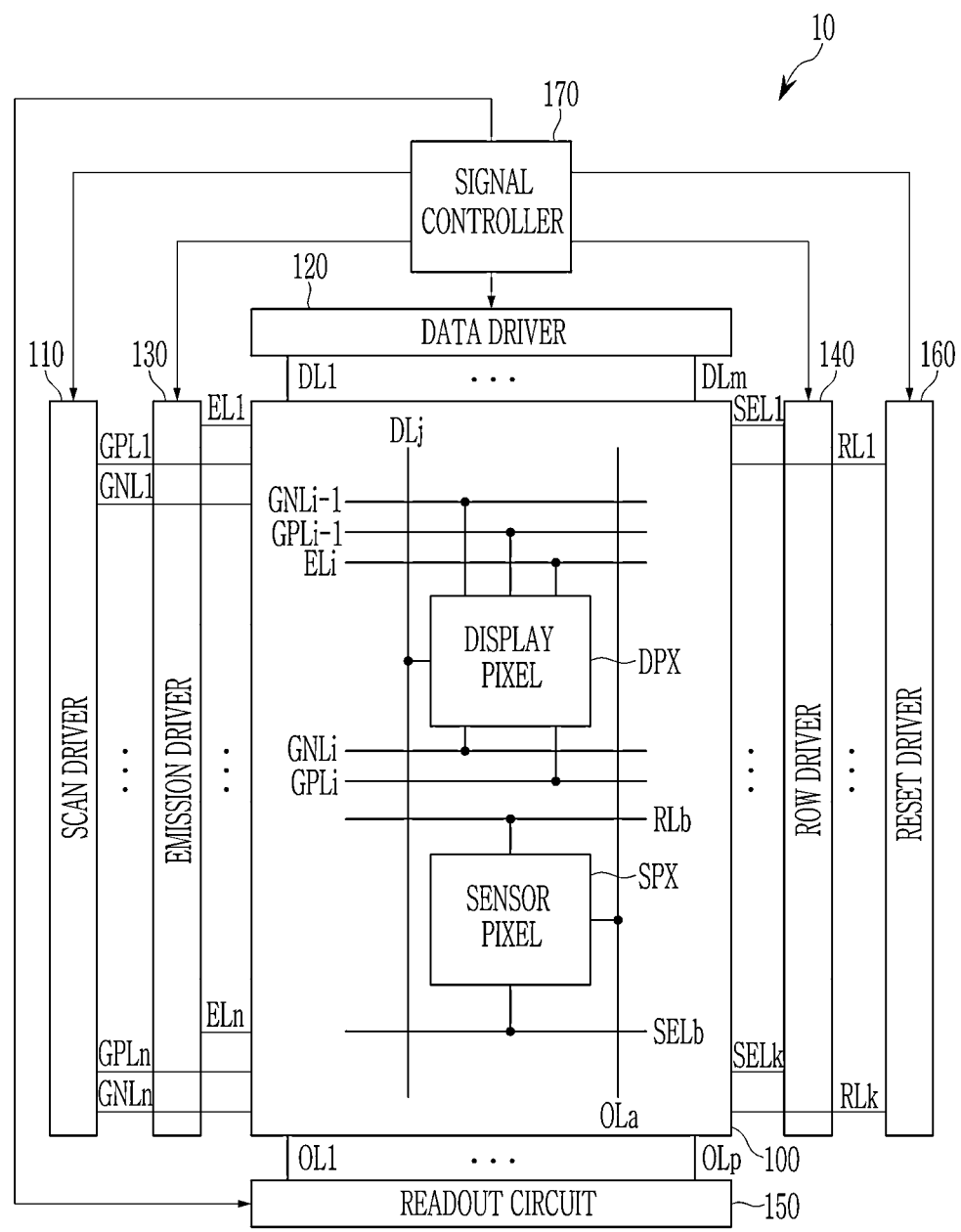
FIG. 1 shows a block diagram of a display device according to some example embodiments.

The present inventive concepts will be described more fully hereinafter with reference to the accompanying drawings, in which embodiments of the inventive concepts are shown. As those skilled in the art would realize, the described embodiments may be modified in various different ways, all without departing from the spirit or scope of the present inventive concepts.

The drawings and description are to be regarded as illustrative in nature and not restrictive, and like reference numerals designate like elements throughout the specification.

The size and thickness of each configuration shown in the drawings are arbitrarily shown for better understanding and ease of description, but the present inventive concepts are not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise", and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular,"

or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 shows a block diagram of a display device according to some example embodiments. The display device 10 displays videos or still images and it may be used as a displaying screen for various types of products such as televisions, laptops, monitors, billboards, or Internet of Things (IOT) in addition to portable electronic devices such as mobile phones, smart phones, tablet PCs, smart watches, watch phones, mobile communication terminals, digital organizers, electronic books, portable multimedia players (PMP), global positioning systems, or ultra mobile PCs (UMPC). Regarding the display device 10, an organic light emitting diode (OLED) displays or a quantum dot light emitting diode display will be described hereinafter, and the display device 10 may be a liquid crystal display device or a field emission display device and is not limited thereto.

Referring to FIG. 1, the display device 10 includes a display unit 100 (also referred to herein as a display panel, a pixel array, or the like) including a sensor pixel (SPX) for capturing images (e.g., configured to capture images) and a display pixel (DPX) for displaying images (e.g., configured to display images), a plurality of drivers 110, 120, 130, 140, 150, and 160 for applying signals for driving (e.g., configured to apply signals to drive) the sensor pixel (SPX) and the display pixel (DPX), and a signal controller 170 for controlling (e.g., configured to control) the plurality of drivers 110, 120, 130, 140, 150, and 160.

A plurality of display pixels (DPX) and a plurality of sensor pixels (SPX) are positioned on (e.g., in) the display unit 100. A number (e.g., quantity) of the sensor pixels (SPX) is equal to or less than a number (e.g., quantity) of the display pixels (DPX) in the display unit 100.

The respective display pixels (DPX) are connected to four corresponding scan lines from among a plurality of scan lines (GPL1 to GPLn and GNL1 to GNLn, where n is any integer) connected to the display unit 100, one corresponding light emission control line from among a plurality of light emission control lines (EL1 to ELn), and one corresponding data line from among a plurality of data lines (DL1 to DLm, where m is any integer and may be equal to or different from n). Although not directly shown in the display unit 010 of FIG. 1, the display pixels (DPX) are respectively connected to a power supply line connected to the display unit 100 and receive a first power source voltage (ELVDD of FIGS. 2A-2B), a second power source voltage (ELVSS of FIGS. 2A-2B), and an initialization voltage (Vint of FIGS. 2A-2B).

The respective sensor pixels (SPX) are connected to one corresponding selection signal line from among a plurality of selection signal lines (SEL1 to SELk, where k is any integer and may be equal to or different from n and/or m) connected to the display unit 100, one corresponding reset signal line from among a plurality of reset signal lines (RL1 to RLk), and one corresponding readout line from among a plurality of readout lines (OL1 to OLp, where p is any integer and may be equal to or different from n, m, and/or k). Further, although not directly shown in the display unit 010 of FIG. 1, the respective sensor pixels (SPX) are connected to the power supply line connected to the display unit 100 and receive a first driving voltage (VDD of FIGS. 2A-2B, FIG. 4, and FIG. 5) and a second driving voltage (VSS of FIGS. 2A-2B, FIG. 4, and FIG. 5).

The display pixels (DPX) of the display unit 100 are respectively connected to four corresponding scan lines. The display pixels (DPX) are connected to two scan lines (GPLi and GNLi) corresponding to a pixel row including the corresponding pixel and two scan lines (GPLi−1 and GNLi−1) corresponding to a pixel row that is prior to the pixel row. A signal applied to the scan line (GPLi) is an inverted signal of the signal applied to the scan line (GNLi). In a like way, the signal applied to the scan line (GPLi−1) is an inverted signal of the signal applied to the scan line (GNLi−1).

The display pixels (DPX) respectively emit light with particular (or, alternatively, predetermined) luminance by a driving current supplied to the organic light emitting diode (OLED) according to corresponding data signals transmitted through a plurality of data lines (DL1 to DLm).

The scan driver 110 generates scan signals corresponding to the respective display pixels (DPX) and transmits the same through the scan lines (GPL1 to GPLn and GNL1 to GNLn). That is, the scan driver 110 transmits scan signals to the display pixels (DPX) included in the respective pixel rows through the corresponding scan lines.

The scan driver 110 receives a control signal from the signal controller 170 to generate a plurality of scan signals, and sequentially supplies the scan signals to the scan lines (GPL1 to GPLn and GNL1 to GNLn) connected to the respective pixel rows.

The data driver 120 transmits the data signal to the respective pixels through the data lines (DL1 to DLm).

The data driver 120 receives a control signal and an image data signal from the signal controller 170 and supplies corresponding data signals to the data lines (DL1 to DLm) connected to the respective display pixels (DPX) included in the respective pixel rows.

The light emission control driver 130 is connected to a plurality of light emission control lines (EL1 to ELn). That is, the light emission control lines (EL1 to ELn) extending in parallel or substantially in parallel to each other in the row direction to the display pixels (DPX) connects the respective display pixels (DPX) and the light emission control driver 130.

The light emission control driver 130 generates light emission control signals corresponding to the respective display pixels (DPX) through the light emission control lines (EL1 to ELn). The respective display pixels (DPX) having received the light emission control signal is controlled to emit the image according to the image data signal in response to control of the light emission control signal. That is, an operation of the light emission control transistor included in the respective display pixels (DPX) is controlled in response to the light emission control signal transmitted through the corresponding light emission control line, and the organic light emitting diode (OLED) connected to the light emission control transistor may or may not emit light with luminance according to the driving current corresponding to the data signal.

The signal controller 170 converts a plurality of video signals transmitted from the outside (e.g., external to the display device 10) into a plurality of image data signals and transmits them to the data driver 120. The signal controller 170 receives a vertical synchronization signal Vsync, a horizontal synchronization signal (Hsync), and clock signals (MCLK), generates control signals for controlling driving of the scan driver 110, the light emission control driver 130, and the data driver 120, and transmits them to the corresponding drivers. That is, the signal controller 170 generates a signal for controlling the scan driver 110, a signal for controlling the light emission control driver, and a signal for controlling the data driver 120, and transmits them.

The sensor pixels (SPX) of the display unit 100 are respectively connected to a corresponding selection signal line and a reset signal line. The sensor pixel (SPX) is connected to the selection signal line (SELb) and a reset signal line (RLb) corresponding to the pixel row including the corresponding pixel.

The sensor pixels (SPX) transmit the electrical signal generated by a photoelectric conversion element through a plurality of readout lines (OL1 to OLp). The photoelectric conversion element includes elements for storing photo charges such as a photodiode, a photo gate, or a photo transistor, and an organic photodiode (OPD) will be referred to as it hereinafter.

A row driver 140 applies a selection signal to a selection signal line (SELb) for reading out the electrical signal.

The row driver 140 receives the control signal from the signal controller 170 to generate a plurality of selection signals, and sequentially supplies the select signals to a plurality of selection signal lines (SEL1 to SELk) connected to the respective pixel rows.

The readout circuit 150 may generate pixel data by performing a sampling operation on the electrical signals provided by the respective sensor pixels (SPX) through the readout lines (OL1 to OLp). The readout circuit 150 may include an analog-to-digital converter (not shown), and may convert the electrical signal having an analog value from a plurality of sensor pixels (SPX) into pixel data having a digital value.

For example, the readout circuit 150 may perform a correlated double sampling operation on the electrical signal output (e.g., transmitted) by the readout lines (OL1 to OLp) by applying a correlated double sampling (CDS) method. Further, for example, the readout circuit 150 may be designed with various methods such as an analog CDS method, a digital CDS method, or a dual CDS method.

The reset driver 160 may receive a control signal from the signal controller 170 to generate a plurality of reset signals, and supply reset signals to a plurality of reset signal lines (RL1 to RLk) connected to the respective pixel rows. The photoelectric conversion element of the sensor pixel (SPX) having received the reset signal is reset.

The signal controller 170 may receive pixel data from the readout circuit 150, may process the same, and may output (e.g., transmit) image data. One frame image may be realized by the sensor pixel (SPX), and the image data output (e.g., transmitted) by the signal controller 170 may correspond to one frame. Also, the signal controller 170 may perform various types of processing operations such as color interpolation, color correction, auto white balance, gamma correction, color saturation correction, format correction, bad pixel correction, or hue correction.

The display pixel (DPX) and the sensor pixel (SPX) will now be described with reference to FIGS. 2A-2B.

Figure 2A:
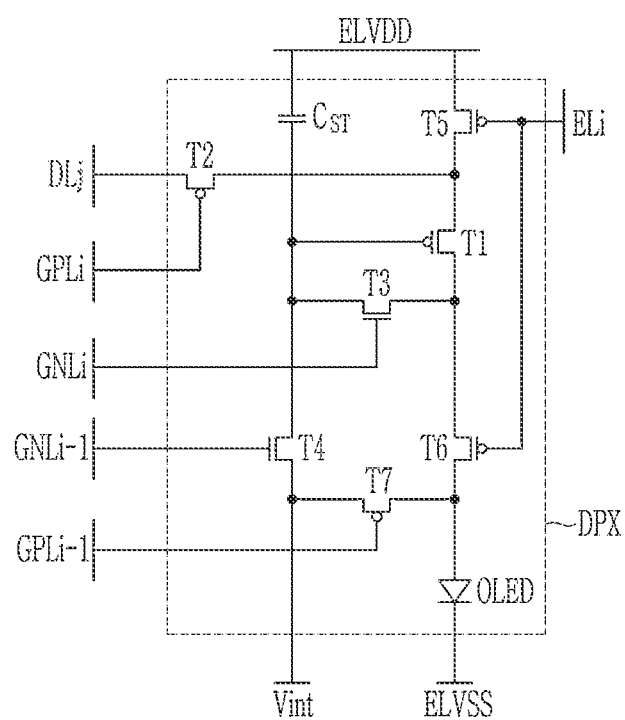
FIGS. 2A-2B show a circuit diagram of a display pixel and a sensor pixel according to some example embodiments.
Figure 2B:
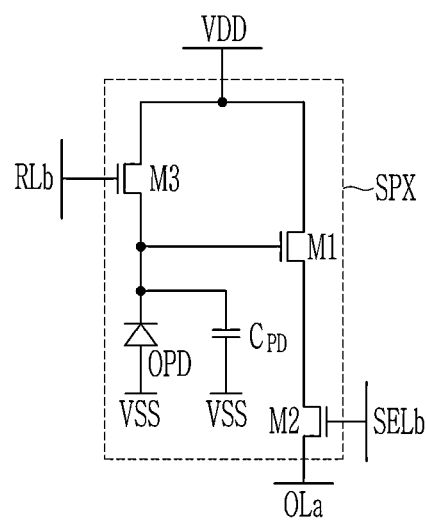

FIGS. 2A-2B show circuit diagrams of a display pixel and a sensor pixel according to some example embodiments. As shown, each separate pixel of the display pixels (DPX) and the sensor pixels (SPX) may include a separate plurality of transistors, each separate plurality in each separate pixel including at least one transistor that includes a silicon semiconductor layer and at least one other transistor that includes an oxide semiconductor layer.

FIG. 2A shows a circuit diagram of the display pixel (DPX). The display pixel (DPX) includes an organic light emitting diode (OLED), a storage capacitor Cst, and first to seventh transistors (T1 to T7). Signal lines (GPLi−1, GNLi−1, GPLi, GNLi, ELi, and DLj), an initialization voltage line (Vint), and power source voltage lines (ELVDD and ELVSS) are connected to the display pixel (DPX).

The first to seventh transistors (T1 to T7) may be realized with thin film transistors. From among the first to seventh transistors (T1 to T7), the third transistor T3 and the fourth transistor T4 may be realized with NMOS transistors (n-channel MOSFET), and the others may be realized with PMOS transistors (p-channel MOSFET).

The first transistor T1 includes a gate connected to a first node N1, a source connected to a second node N2 connected to a drain of the fifth transistor T5, and a drain connected to a third node N3. The driving current flows through the first transistor T1 according to the data signal charged in the storage capacitor (CST).

The driving current corresponds to a voltage difference between the source and the gate of the first transistor T1, and the driving current is varied corresponding to the data voltage following the applied data signal.

The second transistor T2 includes a gate connected to the scan line (GPLi), a source connected to the data line (DLj), and a drain connected to the second node N2 connected in common to the source of the first transistor T1 and a drain of the fifth transistor T5. The second transistor T2 transmits the data voltage caused by the data signal transmitted through the data line (DLj) to the second node N2 in response to the corresponding scan signal transmitted through the scan line (GPLi).

The third transistor T3 includes a gate connected to the scan line (GNLi), and respective ends connected to the gate and the drain of the first transistor T1. The third transistor T3 is operable in response to the corresponding scan signal transmitted through the scan line (GNLi). The turned-on third transistor T3 connects the gate and the drain of the first transistor T1 to diode-connect the first transistor T1.

When the first transistor T1 is diode-connected, the voltage compensated by a threshold voltage of the first transistor T1 from the data voltage applied to the source of the first transistor T1 is applied to the gate of the first transistor T1. The gate of the first transistor T1 is connected to one electrode of the storage capacitor ($C_{ST}$), so the voltage is maintained by the storage capacitor ($C_{ST}$). The voltage of which a threshold voltage of the first transistor T1 is compensated is applied to the gate and is then maintained, so the driving current flowing to the first transistor T1 is not influenced by the threshold voltage of the first transistor T1.

The fourth transistor T4 includes a gate connected to the scan line (GNLi-1), a source connected to the initialization voltage (Vint) supply line, and a drain connected to the first node N1. The fourth transistor T4 transmits the initialization voltage (Vint) applied through the initialization voltage (Vint) supply line to the first node N1 in response to the scan signal transmitted through the scan line (GNLi-1). The fourth transistor T4 may transmit the initialization voltage (Vint) to the first node N1 before a data signal is applied, in response to the scan signal (S[j-1]) transmitted in advance to the scan line (GNLi-1) corresponding to the pixel row that is prior to the pixel row including the corresponding display pixel (DPX).

In this instance, a voltage value of the initialization voltage (Vint) is not limited, and it may be set to have a low-level voltage value so as to substantially reduce the gate voltage of the first transistor T1 and initialize the same. That is, the gate of the first transistor T1 is initialized with the initialization voltage (Vint) for a period in which the scan signal of the previous pixel row is transmitted with a gate On voltage level to the gate of the fourth transistor T4.

The fifth transistor T5 includes a gate connected to the light emission control line (ELi), a source connected to the supply line of the first power source voltage (ELVDD), and a drain connected to the second node N2.

The sixth transistor T6 includes a gate connected to the light emission control line (ELi), a source connected to the third node N3, and a drain of the anode of the organic light emitting diode (OLED).

The fifth transistor T5 and the sixth transistor T6 are operable in response to the light emission control signal transmitted through the light emission control line (ELi). When the fifth transistor T5 and the sixth transistor T6 are turned on in response to the light emission control signal, a current path is formed in a direction of the organic light emitting diode (OLED) from the first power source voltage (ELVDD) so that the driving current may flow, and then, the organic light emitting diode (OLED) emits light according to the driving current, and the image of the data signal is displayed.

The storage capacitor ($Cm_{ST}$) includes one electrode connected to the first node N1 and another electrode connected to the supply line of the first power source voltage (ELVDD). The storage capacitor ($C_{ST}$) is connected between the gate of the first transistor T1 and the supply line of the first power source voltage (ELVDD) as described above, and the voltage applied to the gate of the first transistor T1 may be maintained.

The seventh transistor T7 includes a gate connected to the scan line (GPLi-1), a source connected to the anode of the organic light emitting diode (OLED), and a drain connected to the power supply line of the initialization voltage (Vint).

The seventh transistor T7 may transmit the initialization voltage (Vint) to the anode of the organic light emitting diode (OLED) in response to the scan signal transmitted to the scan line (GPLi-1) corresponding to the pixel row that is prior to the pixel row including the corresponding display pixel (DPX). The anode of the organic light emitting diode (OLED) is reset to be a sufficiently low voltage by the transmitted initialization voltage (Vint).

The organic light emitting diode (OLED) including a pixel electrode and a facing electrode, and the facing electrode may receive the second power source voltage (ELVSS). The organic light emitting diode (OLED) receives a driving current from the first transistor T1 and emits light to display an image.

In some example embodiments, at least one transistor of a plurality of transistors (T1 to T7) includes a semiconductor layer including an oxide (e.g., at least one transistor of the plurality of transistors includes an oxide semiconductor layer), and the others include a semiconductor layer including silicon (e.g., at least one other transistor of the plurality of transistors includes a silicon semiconductor layer). In detail, the first transistor T1 directly influencing brightness of the display device 10 is configured to include a semiconductor layer made of polysilicon with high reliability, and by this, the high-resolution display device may be realized.

In some example embodiments, the oxide semiconductor has high carrier mobility and a low leakage current, so when a driving time is long, a voltage drop is not substantial. That is, a color change of an image caused by the voltage drop is not big at the time of low frequency driving, so the low frequency driving is possible. As the oxide semiconductor has a merit of a less leakage current, the leakage current that may flow to the gate of the first transistor T1 may be reduced or prevented and power consumption may be simultaneously reduced by using at least one of the third transistor T3 or the fourth transistor T4 connected to the gate of the first transistor T1 as an oxide semiconductor.

The semiconductor layer of the oxide transistor may be manufactured with various metal oxides. For example, the oxide semiconductor layer may include any one of oxides made of titanium (Ti), hafnium (Hf), zirconium (Zr), aluminum (Al), tantalum (Ta), germanium (Ge), zinc (Zn), gallium (Ga), tin (Sn) and indium (In), and their composite oxides which are a zinc oxide (ZnO), an indium-gallium-zinc oxide (InGaZnO), an indium-zinc oxide (Zn—In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—

O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), or a hafnium-indium-zinc oxide (Hf—In—Zn—O).

FIG. 2B shows a circuit diagram of a sensor pixel (SPX). The sensor pixel (SPX) includes an organic photodiode (OPD) and first to third transistors (M1 to M3). The sensor pixel (SPX) is connected to the signal lines (SELb, Ola, and RLb) and the driving voltage line (VDD and VSS).

The anode of the organic photodiode (OPD) is connected to the driving voltage line (VSS).

The first to third transistors (M1 to M3) may be realized with thin film transistors. The first to third transistors (M1 to M3) may be realized with NMOS transistors.

The first transistor M1 includes a gate connected to a cathode of the organic photodiode (OPD), a drain connected to the driving voltage line VDD, and a source connected to a drain of the second transistor M2. When light is input to the photoelectric conversion element, a gate potential of the first transistor M1 increases by the charges generated at this time, and a sensing current is output (e.g., transmitted) to the readout line (Ola). The sensing current corresponds to a voltage difference between the drain and the gate of the first transistor M1, and is varied corresponding to the electrical signal generated by the photoelectric conversion element.

The second transistor M2 includes a gate connected to the selection signal line (SELb), a drain connected to the source of the first transistor M1, and a source connected to the readout line (OLa). The second transistor M2 transmits a sensing current to the readout line (OLa) in response to the corresponding selection signal transmitted through the selection signal line (SELb).

The third transistor M3 includes a gate connected to the reset signal line (RLb), a drain connected to the driving voltage line VDD, and a source connected to the cathode of the organic photodiode (OPD). The third transistor M3 initializes a potential at the source (the cathode of the organic photodiode (OPD), and the gate of the first transistor M1) potential of the third transistor M3 with the driving voltage VDD in response to the corresponding reset signal transmitted through the reset signal line (RLb).

In some example embodiments, at least one of a plurality of transistors (M1 to M3) includes a semiconductor layer including an oxide, and the others include semiconductor layers including silicon (e.g., at least one transistor of the plurality of transistors includes a silicon semiconductor layer, and at least one other transistor of the plurality of transistors includes an oxide semiconductor layer). In detail, the first transistor M1 is configured to include a semiconductor layer made of polysilicon with high reliability, high mobility, and a frequency characteristic, and the third transistor M3 may use an oxide semiconductor with a lesser leakage current to reduce or prevent the leakage current that may flow to the cathode of the organic photodiode (OPD) and simultaneously reduce power consumption.

A configuration of a sensor pixel (SPX) including a transistor with a polysilicon semiconductor layer and a transistor with an oxide semiconductor layer will now be described with reference to FIG. 3.

Figure 3:
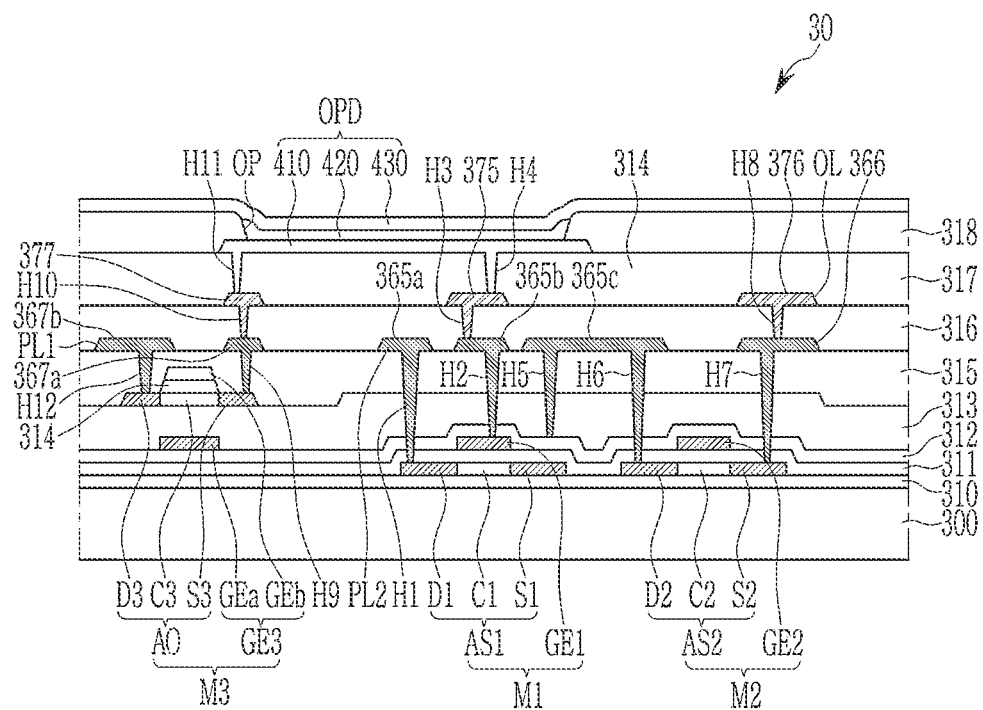
FIG. 3 shows a cross-sectional view of a display device according to some example embodiments.

FIG. 3 shows a cross-sectional view of a display device according to some example embodiments.

The display device 30 according to some example embodiments may include a substrate 300, a first transistor M1 and a second transistor M2 including a silicon semiconductor, and a third transistor M3 including an oxide semiconductor.

The substrate 300 may include a glass material, a ceramic material, a metallic material, or a flexible or bendable material. When the substrate 300 has a flexible or bendable characteristic, the substrate 300 may include polymer resin such as polyethersulphone, polyarylate, polyetherimide, polyethylene naphthalate, polyethylene terephthalate, polyphenylene sulfide, polyarylate, polyimide, polycarbonate, and cellulose acetate propionate. The substrate 300 may have a single-layer or multi-layer structure of the material, and the multi-layer structure may further include an inorganic layer. In an example, the substrate 300 may have an organic material/inorganic material/organic material stacking structure, or an organic material/inorganic material/organic material/inorganic material stacking structure.

The buffer layer 310 may function to increase planarization of an upper side of the substrate 300, and may include an inorganic insulating material such as a silicon oxide, a silicon nitride, and a silicon oxynitride.

A first semiconductor layer AS1 of the first transistor M1 and a second semiconductor layer AS2 of the second transistor M2 including a silicon semiconductor may be disposed on the buffer layer 310. The first semiconductor layer AS1 may include a source region S1 and a drain region D1 to which an impurity is doped to have conductivity and which are spaced from each other, and a channel region C1 disposed therebetween. The source region S1 and the drain region D1 may respectively correspond to the source electrode and the drain electrode of the first transistor M1. As some example embodiments, positions of the source region S1 and the drain region D1 are exchangeable. The second semiconductor layer AS2 may include a source region S2 and a drain region D2 to which an impurity is doped to have conductivity and which are spaced from each other, and a channel region C2 disposed therebetween. The source region S2 and the drain region D2 may correspond to the source electrode and the drain electrode of the second transistor M2. As some example embodiments, positions of the source region S2 and the drain region D2 are exchangeable.

A gate electrode (GE1) of the first transistor M1 may be disposed on the first semiconductor layer AS1, and a first insulation layer 311 may be disposed between the first semiconductor layer AS1 and the gate electrode (GE1). The gate electrode (GE2) of the second transistor M2 may be disposed on the second semiconductor layer AS2, and the first insulation layer 311 may be disposed between the second semiconductor layer AS2 and the gate electrode (GE2). The first insulation layer 311 may include an inorganic material including an oxide or a nitride. For example, the first insulation layer 311 may include a silicon oxide, a silicon nitride, a silicon oxynitride, an aluminum oxide, a titanium oxide, a tantalum oxide, and a hafnium oxide.

The gate electrode (GE1) of the first transistor M1 may be disposed to overlap the channel region C1 of the first semiconductor layer AS1, may include molybdenum (Mo), copper (Cu), and titanium (Ti), and may be made of a single layer or a multilayer including the above-noted material.

The gate electrode (GE2) of the second transistor M2 may be disposed to overlap the channel region C2 of the second semiconductor layer AS2, may include molybdenum (Mo), copper (Cu), and titanium (Ti), and may be made of a single layer or a multilayer including the above-noted material.

A second insulation layer 312 may be disposed on the gate electrode (GE1) of the first transistor M1 and the gate electrode (GE2) of the second transistor M2. The second insulation layer 312 may include an inorganic material including an oxide or a nitride. For example, the second insulation layer 312 may include a silicon oxide, a silicon nitride, a silicon oxynitride, an aluminum oxide, a titanium oxide, a tantalum oxide, and a hafnium oxide.

A gate electrode (GEa) of the third transistor M3 may be disposed on the second insulation layer 312. The gate electrode (GEa) may include molybdenum (Mo), copper (Cu), and titanium (Ti), and may be made of a single layer or a multilayer including the above-noted material.

A third insulation layer 313 may be disposed on the gate electrode (GEa). The third insulation layer 313 may include an inorganic material including an oxide or a nitride. For example, the third insulation layer 313 may include a silicon oxide, a silicon nitride, a silicon oxynitride, an aluminum oxide, a titanium oxide, a tantalum oxide, and a hafnium oxide.

A third semiconductor layer (AO) of the third transistor M3 including an oxide semiconductor may be disposed on the third insulation layer 313. The third semiconductor layer (AO) may include a source region S3 and a drain region D3 having conductivity and spaced from each other, and a channel region C3 disposed between the source region S3 and the drain region D3. The oxide semiconductor is a Zn-oxide-based material and it may include a Zn oxide, an In—Zn oxide, and a Ga—In—Zn oxide. For example, the third semiconductor layer (AO) may be a semiconductor of IGZO (In—Ga—Zn—O), ITZO (In—Sn—Zn—O), or IGTZO (In—Sn—Zn—Zn—O) made by containing a metal such as indium (In), gallium (Ga), or tin (Sn) in the ZnO. The source region S3 and the drain region D3 of the third semiconductor layer (AO) may be made by adjusting a carrier concentration of the oxide semiconductor and making it conductive. For example, the source region S3 and the drain region D3 may be formed by increasing the carrier concentration through a plasma treatment using hydrogen (H)-based gas, fluorine (F)-based gas, or a combination thereof to the oxide semiconductor.

The third transistor M3 may include a double gate electrode. For example, the first gate electrode (GEa) may be disposed at a bottom of the third semiconductor layer (AO) of the third transistor M3, and a second gate electrode (GEb) may be disposed at a top of the third semiconductor layer (AO) of the third transistor M3. The third insulation layer 313 may be disposed between the first gate electrode (GEa) of the third transistor M3 and the third semiconductor layer (AO). The first gate electrode (GEa) may overlap the channel region C3 of the third semiconductor layer (AO).

A fourth insulation layer 314 may be disposed between the third semiconductor layer (AO) of the third transistor M3 and the second gate electrode (GEb). The second gate electrode (GEb) may overlap the channel region C3 of the third semiconductor layer (AO). The fourth insulation layer 314 may be made according to the same mask process as the second gate electrode (GEb), and in this case, the fourth insulation layer 314 may be made to have the substantially equivalent shape (e.g., equal or substantially equal shape) to the second gate electrode (GEb).

The fourth insulation layer 314 may include an inorganic material including an oxide or a nitride. For example, the fourth insulation layer 314 may include a silicon oxide, a silicon nitride, a silicon oxynitride, an aluminum oxide, a titanium oxide, a tantalum oxide, and a hafnium oxide. The second gate electrode (GEb) includes molybdenum (Mo), copper (Cu), and titanium (Ti), and may be made of a single layer or a multilayer including the above-noted material.

The fifth insulation layer 315 may cover the third transistor M3. The fifth insulation layer 315 may be disposed at the top of the second gate electrode (GEb), and a power source voltage line (PL), connection electrodes 367a, 367b, 365a, and 366, and a source electrode (a drain electrode of the second transistor M2) 365b of the first transistor M1 may be disposed on the fifth insulation layer 315.

The fifth insulation layer 315 may include an inorganic material including an oxide or a nitride. For example, the fifth insulation layer 315 may include a silicon oxide, a silicon nitride, a silicon oxynitride, an aluminum oxide, a titanium oxide, a tantalum oxide, and a hafnium oxide.

The power source voltage lines PL1 and PL2 and the connection electrodes 367a, 367b, 365a, 365b, 365c, and 366 may be made of materials with relatively high conductivity. The power source voltage lines PL1 and PL2 and the connection electrodes 367a, 367b, 365a, 365b, 365c, and 366 may include aluminum (Al), copper (Cu), and titanium (Ti), and may be made into a single layer or a multilayer including the above-noted materials. In an example, the power source voltage lines PL1 and PL2 and the connection electrodes 367a, 367b, 365a, 365b, 365c, and 366 may have a stacking structure of triple layers in which titanium, aluminum, and titanium (Ti/Al/Ti) are sequentially disposed.

The connection electrodes 367a and 367b may be connected to the third semiconductor layer (AO) through a corresponding contact hole from among contact holes (H9 and H12). The contact holes (H9 and H12) penetrate through the fifth insulation layer 315, and may expose part of the third semiconductor layer (AO). Part of the connection electrode 367a may be electrically connected to the third semiconductor layer (AO) through the contact hole H9, and part of the connection electrode 367b may be electrically connected to the third semiconductor layer (AO) through the contact hole H12.

The connection electrode 365c may be connected to the first semiconductor layer AS1 through the contact hole H1. The contact hole H1 penetrates through the first insulation layer 311, the second insulation layer 312, the third insulation layer 313, and the fifth insulation layer 315, and may expose part of the first semiconductor layer AS1. Part of the connection electrode 365c may be electrically connected to the first semiconductor layer AS1 through the contact hole H1.

The connection electrode 365b may be connected to the gate electrode (GE1) through the contact hole H2. The contact hole H2 penetrates through the second insulation layer 312, the third insulation layer 313, and the fifth insulation layer 315, and it may expose part of the gate electrode (GE1). Part of the connection electrode 365b may be electrically connected to the gate electrode (GE1) through the contact hole H2.

The connection electrode 365c may be connected to the first semiconductor layer AS1 through a contact hole H5, and may be connected to the second semiconductor layer AS2 through a contact hole H6. The contact hole H5 penetrates through the first insulation layer 311, the second insulation layer 312, the third insulation layer 313, and the fifth insulation layer 315, and it may expose part of the first semiconductor layer AS1. Part of the connection electrode 365c may be electrically connected to the first semiconductor layer AS1 through the contact hole H1. The contact hole H6 penetrates through the first insulation layer 311, the second insulation layer 312, the third insulation layer 313, and the fifth insulation layer 315, and it may expose part of the second semiconductor layer AS2. Part of the connection electrode 365c may be electrically connected to the second semiconductor layer AS2 through the contact hole H6.

The connection electrode 366 may be connected to the second semiconductor layer AS2 through a contact hole H7. The contact hole H7 penetrates through the first insulation layer 311, the second insulation layer 312, the third insulation layer 313, and the fifth insulation layer 315, and it may expose part of the second semiconductor layer AS2. Part of the connection electrode 366 may be electrically connected to the second semiconductor layer AS2 through the contact hole H7.

A sixth insulation layer 316 that is a planarized layer may be disposed on the power source voltage lines PL1 and PL2 and the connection electrodes 367a, 367b, 365a, 365b, 365c, and 366. The sixth insulation layer 316 may include an organic material such as acryl, benzocyclobutene (BCB), polyimide, or hexamethyldisiloxane (HMDSO). In another way, the sixth insulation layer 316 may include an inorganic material. The sixth insulation layer 316 functions as a protective layer for covering the first transistor M1, the second transistor M2, and the third transistor M3, and the upper side of the sixth insulation layer 316 may be planar. The sixth insulation layer 316 may be a single layer or a multilayer.

A data line (OL) and connection electrodes 375, 376, and 377 may be disposed on the sixth insulation layer 316.

The connection electrode 377 may be connected to the connection electrode 367a through a contact hole H10. The contact hole H10 penetrates through the sixth insulation layer 316, and may expose part of the connection electrode 367a. Part of the connection electrode 377 may be electrically connected to the connection electrode 367a through the contact hole H10.

The connection electrode 375 may be connected to the connection electrode 365b through a contact hole H3. The contact hole H3 penetrates through the sixth insulation layer 316, and may expose part of the connection electrode 365b. Part of the connection electrode 375 may be electrically connected to the connection electrode 365b through the contact hole H3.

The connection electrode 376 may be connected to the connection electrode 366 through a contact hole H8. The contact hole H8 penetrates through the sixth insulation layer 316, and may expose part of the connection electrode 366. Part of the connection electrode 376 may be electrically connected to the connection electrode 366 through the contact hole H8.

The data line (OL) and the connection electrodes 375, 376, and 377 may be made of conductive materials such as a metal or a conductive oxide. For example, the data line (OL) and the connection electrodes 375, 376, and 377 include aluminum (Al), copper (Cu), and titanium (Ti), and they may include a single layer or a multilayer including the above-noted materials. As some example embodiments, the data line (OL) and the connection electrodes 375, 376, and 377 may have a stacking structure with triple layers of sequentially disposed titanium, aluminum, and titanium (Ti/Al/Ti). A seventh insulation layer 317 may be disposed at the top of the data line (OL) and the connection electrodes 375, 376, and 377.

An organic photodiode (OPD) may be disposed on the seventh insulation layer 317. The organic photodiode (OPD) may include a connection electrode 410, a facing electrode 430, and an intermediate layer 420 provided therebetween and including an emission layer.

The connection electrode 410 may be connected to the connection electrode 377 through a contact hole H11. The contact hole H11 penetrates through the seventh insulation layer 317, and it may expose part of the connection electrode 377. Part of the connection electrode 410 may be electrically connected to the connection electrode 377 through the contact hole H11. The connection electrode 410 may be connected to the third transistor M3 by the connection electrode 377 and the connection electrode 367a.

The connection electrode 410 may be connected to the connection electrode 375 through a contact hole H4. The contact hole H4 penetrates through the seventh insulation layer 317, and it may expose part of the connection electrode 375. Part of the connection electrode 410 may be electrically connected to the connection electrode 375 through the contact hole H4. The connection electrode 410 may be connected to the first transistor M1 by the connection electrode 375 and the connection electrode 365b.

An eighth insulation layer 318 as a pixel defining layer may be disposed at the top of the seventh insulation layer 317. The eighth insulation layer 318 has openings that correspond to the respective sensor pixels (SPX), that is, openings (OP) for exposing part of the connection electrode 410, so it may function to define light receiving regions of the sensor pixels (SPX). Further, the eighth insulation layer 318 reduces or prevents arcs from being generated at an edge of the connection electrode 410 by increasing a distance between the edge of the connection electrode 410 and the facing electrode 430 at the top of the connection electrode 410. The eighth insulation layer 318 may, for example, be made of an organic material such as a polyimide or a hexamethyldisiloxane (HMDSO).

The connection electrode 410 is disposed on the seventh insulation layer 317, and may include conductive oxides such as an indium tin oxide (ITO), an indium zinc oxide (IZO), a zinc oxide (ZnO), an indium oxide (In2O3), an indium gallium oxide (IGO), or an aluminum zinc oxide (AZO). As some example embodiments, the connection electrode 410 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof. As some example embodiments, the connection electrode 410 may further include a layer made of ITO, IZO, ZnO, or $In_2O_3$ above/below the reflective layer.

The intermediate layer 420 of the organic photodiode (OPD) includes a photoelectric conversion layer. The photoelectric conversion layer may include a polymer or a low molecular organic material for generating photo charges according to an amount of incident light.

The intermediate layer 420 may include an electron donating organic material and an electron accepting organic material.

For example, the intermediate layer 420 may include a first layer including one of the electron donating organic material or the electron accepting organic material and a second layer including the other of the electron donating organic material and the electron accepting organic material. That is, when the first layer is realized with one of a p-type organic material or an n-type organic material, for example, when the first layer is realized with the n-type organic material, the second layer may be realized with the other one of the p-type organic material or the n-type organic material, for example, the p-type organic material. Here, the electron donating organic material may generate donor ions in response to light, and the electron accepting material may generate acceptor ions in response to the light. The first layer and the second layer may form a hetero p-n junction.

According to some example embodiments, the intermediate layer 420 may be realized with an organic material that is a mixture of the electron donating organic material and the electron accepting organic material.

The facing electrode 430 is disposed to face the connection electrode 410 with the intermediate layer 420 therebetween. The facing electrode 430 may be made of a conductive material. For example, the facing electrode 430 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In another way, the facing electrode 430 may further include a layer of ITO, IZO, ZnO, or $In_2O_3$ on the (semi) transparent layer including the above-noted material. The facing electrode 430 may be disposed on the upper sides of the intermediate layer 420 and the eighth insulation layer 318. The facing electrode 430 may be a common electrode that is integrally formed to a plurality of organic photodiodes (OPD) and faces a plurality of connection electrodes 410 in the display area (DA).

A thin film encapsulation layer (not shown) or a sealing substrate (not shown) may be disposed on an organic photodiode (OPD) to thus cover the organic photodiode and protect them. The thin film encapsulation layer (not shown) may cover the display area and may extend to the outside of the display area. The thin film encapsulation layer may include an inorganic encapsulation layer made of at least one inorganic material and an organic encapsulation layer made of at least one organic material. In an example, the thin film encapsulation layer may include a sequentially stacking structure in order of a first inorganic encapsulation layer, an organic encapsulation layer, and a second inorganic encapsulation layer. The sealing substrate (not shown) is disposed to face the substrate 300, and it may be bonded to the substrate 300 by a sealing member such as a sealant or frit outside the display area.

The thin film encapsulation layer (not shown) or the sealing substrate (not shown) may include a convex micro lens which may have a particular (or, alternatively, predetermined) curvature radius. Accordingly, the micro lens may collect the light that is input to the sensor pixel (SPX). The micro lens may, for example, include an organic material such as a light transmittable resin, and it is not limited thereto.

A spacer for reducing or preventing mask scratching may be further included on the eighth insulation layer 318, and various kinds of function layers such as a polarization layer for reducing reflection of external light, a black matrix, a color filter, and/or a touchscreen including a touch electrode may be installed on the thin film encapsulation layer.

A sensor pixel according to some example embodiments will now be described with reference to FIG. 4 and FIG. 5.

Figure 4:
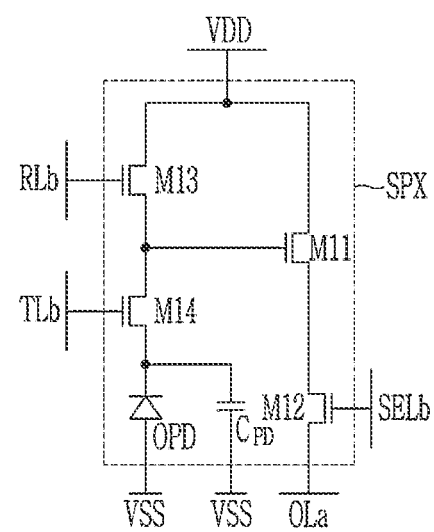
FIG. 4 shows a circuit diagram of a sensor pixel according to some example embodiments.
Figure 5:
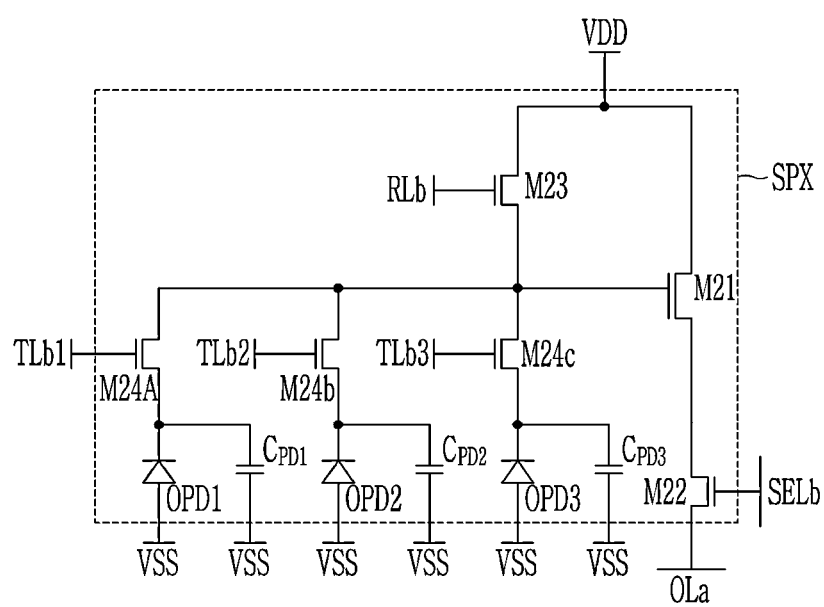
FIG. 5 shows a circuit diagram of a sensor pixel according to some example embodiments.

FIG. 4 shows a circuit diagram of a sensor pixel according to some example embodiments, and FIG. 5 shows a circuit diagram of a sensor pixel according to some example embodiments.

Referring to FIG. 4, the sensor pixel (SPX1) further includes a fourth transistor M14, compared to the sensor pixel (SPX) shown in FIG. 2A.

The fourth transistor M14 may be realized to be a thin film transistor. The fourth transistor M14 may be realized with a NMOS transistor.

A first transistor M11 includes a gate connected to the drain (a source of a third transistor M13) of the fourth transistor M14, a drain connected to the driving voltage line VDD, and a source connected to a drain of a second transistor M12. When light is input to the photoelectric conversion element, a gate potential of the first transistor M11 increases by the charges generated at this time, and a sensing current is output (e.g., transmitted) to the readout line (OLa). The sensing current corresponds to the voltage difference between the drain and the gate of the first transistor M11, and it is variable corresponding to the electrical signal generated by the photoelectric conversion element.

The third transistor M13 includes a gate connected to the reset signal line (RLb), a drain connected to the driving voltage line VDD, and a source connected to the drain of the fourth transistor M14. The third transistor M3 responds to the reset signal transmitted through the reset signal line (RLb) to initialize the source (the gate of the first transistor M11) potential of the third transistor M13 to be the driving voltage VDD.

The fourth transistor M14 includes a gate connected to the transmitting signal line (TLb), a drain connected to the gate (third transistor M13 source) of the first transistor M11, and a source connected to the cathode of the organic photodiode (OPD). When light is input to the photoelectric conversion element, the source potential of the fourth transistor M14 is increased by the charges generated at this time, and when the fourth transistor M14 is turned on by the signal supplied by the transmitting signal line (TLb), a bias of the gate electrode of the first transistor M11 is changed, and the second transistor M12 is turned on by the signal supplied by the selection signal line (SELb) to output (e.g., transmit) the sensing current to the readout line (OLa). The sensing current corresponds to the voltage difference between the drain and the gate of the first transistor M11, and it is variable corresponding to the electrical signal generated by the photoelectric conversion element.

In some example embodiments, at least one of a plurality of transistors (M11 to M14) includes a semiconductor layer including an oxide, and the others thereof include semiconductor layers including silicon. In detail, the first transistor M11 is configured to include a semiconductor layer made of polysilicon with high reliability, high mobility, and a frequency characteristic, and the third transistor M13 and the fourth transistor M14 may use an oxide semiconductor with a lesser leakage current to reduce or prevent the leakage current that may flow to the cathode of the organic photodiode (OPD) and simultaneously reduce power consumption.

Referring to FIG. 5, the sensor pixel (SPX2) further includes a plurality of fourth transistors (M24a and M24b), compared to the sensor pixel (SPX1) shown in FIG. 4.

A plurality of fourth transistors (M24a, M24b, and M24c) respectively include a gate connected to the corresponding transmitting signal lines TLb1, TLb2, and TLb3, a drain connected to the gate (the source of the third transistor M23) of the first transistor M21, and a source connected to the cathode of the organic photodiodes OPD1, OPD2, and OPD3.

The organic photodiodes OPD1, OPD2, and OPD3 generate electrical signals according to lights (e.g., green, red, and blue) with different wavelengths. When the light with the corresponding wavelength is input to the photoelectric conversion element, the source potentials of the fourth transistors (M24a, M24b, and M24c) increase by the charges generated at this time, and when the fourth transistors (M24a, M24b, and M24c) are turned on by the signals supplied by the transmitting signal lines TLb1, TLb2, and TLb3, the bias of the gate electrode of the first transistor M21 is changed, and the second transistor M22 is turned on by the signal supplied by the selection signal line (SELb) to thus output (e.g., transmit) the sensing current to the readout line (OLa). The sensing current corresponds to the voltage difference between the drain and the gate of the first transistor M21, and it is variable corresponding to the electrical signal generated by the photoelectric conversion element.

In some example embodiments, at least one of a plurality of transistors (M21 to M23, M24a, M24b, or M24c) includes a semiconductor layer including an oxide, and the others thereof include semiconductor layers including silicon. In detail, the first transistor M21 is configured to include a semiconductor layer made of polysilicon with high reliability, high mobility, and a frequency characteristic, and the third transistor M23 and a plurality of fourth transistors M24a, M24b, and M24c may use an oxide semiconductor with a lesser leakage current to reduce or prevent the leakage current that may flow to the cathode of the organic photodiode (OPD) and simultaneously reduce power consumption.

In the display unit 100, a form in which a light emitting region of the display pixel (DPX) and a light receiving region of the sensor pixel (SPX) are disposed will now be described.

FIGS. 6, 7, 8, 9, and 10 show layout views of a display pixel and a sensor pixel according to some example embodiments. As shown in FIGS. 6-10, the plurality of sensor pixels (SPX) and the plurality of display pixels (SPX) may be arranged in a pattern in the display unit 100, and a ratio of the plurality of sensor pixels (SPX) vs. the plurality of display pixels (DPX) in the display unit 100 may be 1:1 to 1:2.

Figure 6:
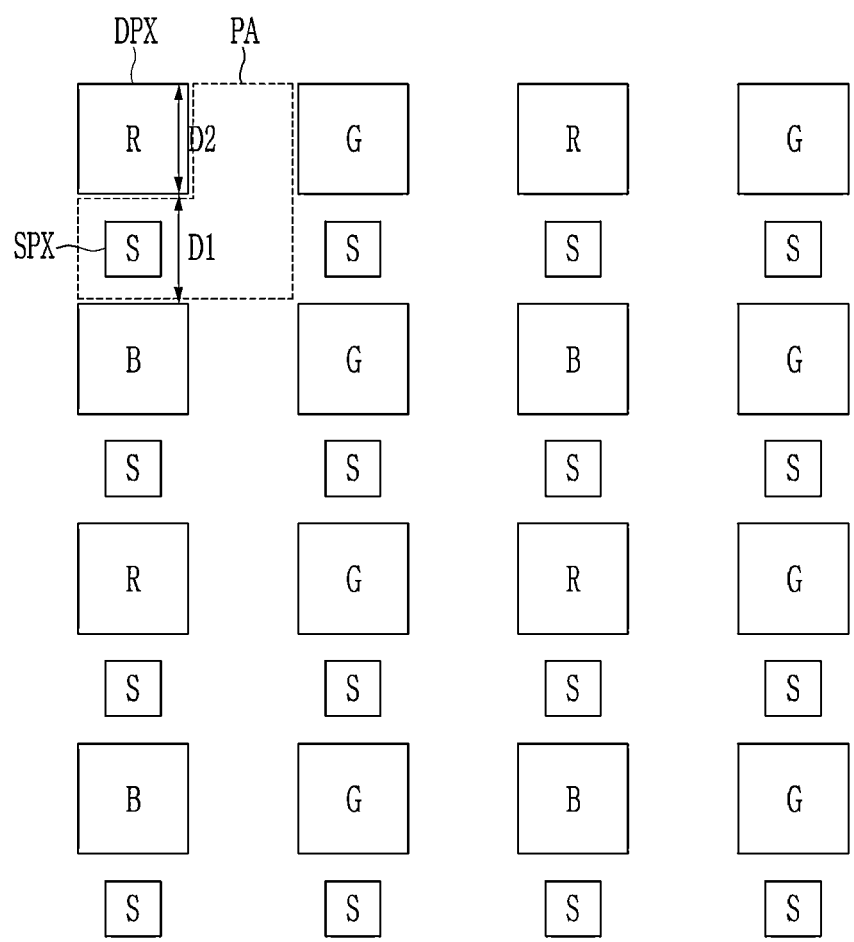
FIGS. 6, 7, 8, 9, and 10 show layout views of a display pixel and a sensor pixel according to some example embodiments.
Figure 7:
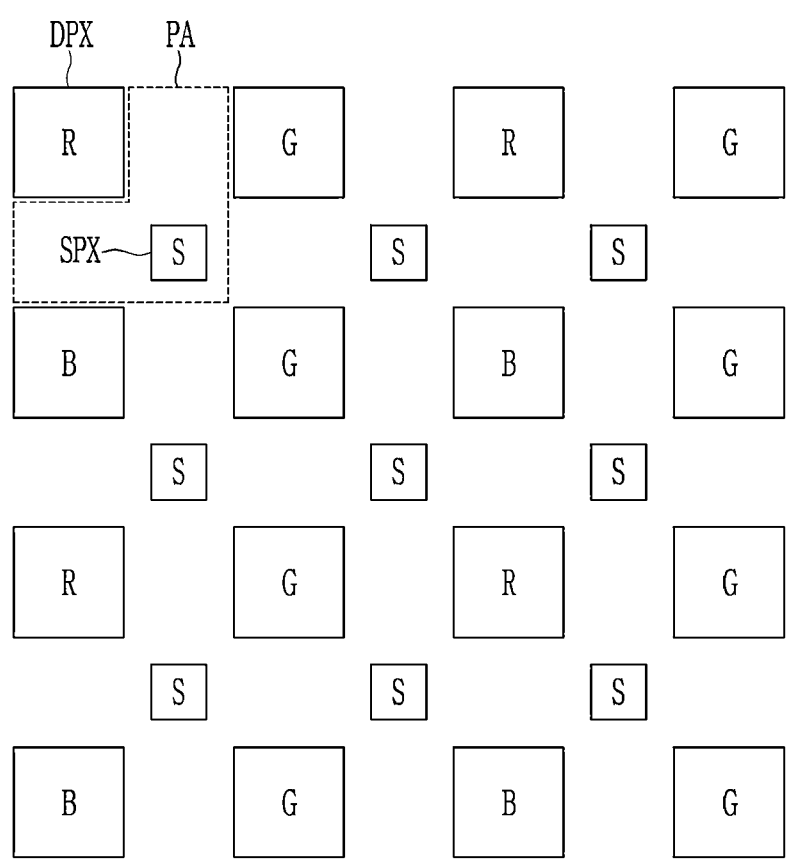

Referring to FIG. 6 and FIG. 7, one sensor pixel (SPX) is adjacently disposed corresponding to (e.g., is adjacent to) one display pixel (DPX) in the display unit 100. The sensor pixel (SPX) may be freely positioned in the adjacent region (PA) of one display pixel (DPX).

For example, the one sensor pixel (SPX) is disposed between two adjacent display pixels (DPX). In this instance, a first direction distance D1 between two display pixels (DPX) with one sensor pixel (SPX) therebetween is less than a first direction length D2 of one display pixel (DPX). Restated, a first direction distance (D1) in a first direction between two adjacent display pixels (DPX) and through one sensor pixel (SPX) therebetween may be less (e.g., smaller) than a first direction length (D2) of one display pixels (DPX) of the two adjacent display pixels (DPX) in the first direction. That is, the sensor pixel (SPX) may be positioned in an area in which the display pixel (DPX) may not be positioned between two display pixels (DPX).

Referring to FIG. 6, a size of the sensor pixel (SPX) is illustrated to be less than a size of the display pixel (DPX), and in a certain region in the display unit 100, the size of the sensor pixel (SPX) may be greater than the size of the display pixel (DPX). For example, the sensor pixel (SPX) is smaller than the adjacent display pixel (DPX) in a certain region in the display unit 100, and the sensor pixel (SPX) is bigger than the display pixel (DPX) in another certain region in the display unit 100. For example, one sensor pixel (SPX) corresponding to the size of the peripheral area (PA) may be positioned in another certain region in the display unit 100.

Figure 8:
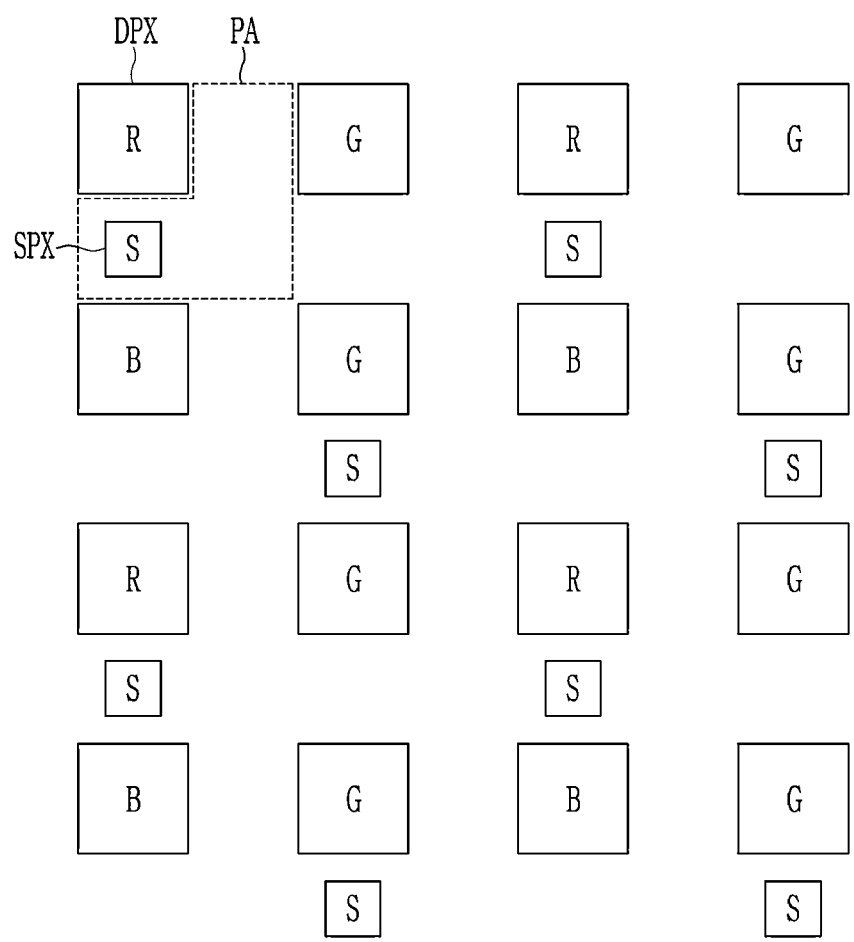

Referring to FIG. 8, one sensor pixel (SPX) is adjacently disposed corresponding to two display pixels (DPX) in the display unit 100. The sensor pixel (SPX) may be freely positioned in the adjacent region (PA) of the display pixel (DPX) in which the sensor pixel (SPX) is adjacently disposed.

The sensor pixel (SPX) is not adjacently positioned on the display pixel (DPX) that is adjacent to the display pixel (DPX) on which the sensor pixel (SPX) is adjacently disposed.

Figure 9:
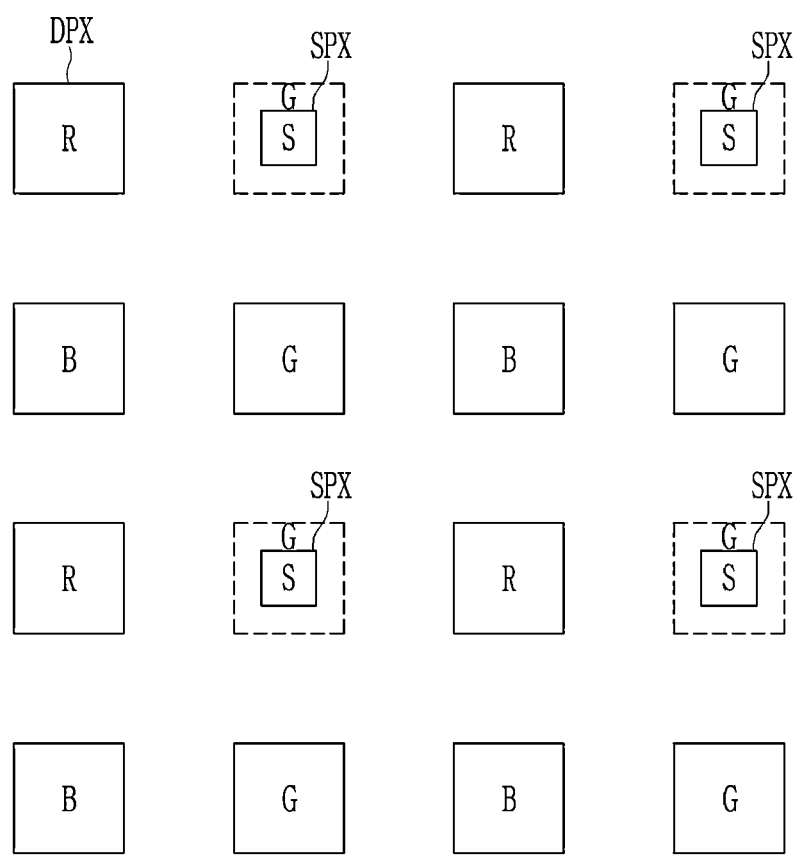

Referring to FIG. 9, one sensor pixel (SPX) is disposed between two display pixels (DPX) in the display unit 100. One sensor pixel (SPX) may be position instead of one display pixel (DPX) in the region in which one display pixel (DPX) will be positioned. The display pixel (DPX) is not positioned in the region in which the sensor pixel (SPX) is positioned. Therefore, the first direction distance between two display pixels (DPX) with one sensor pixel (SPX) therebetween is greater than the first direction length D2 of one display pixel (DPX).

Referring to FIG. 9, the sensor pixel (SPX) is shown to be smaller than the display pixel (DPX), and the sensor pixel (SPX) may be bigger than the display pixel (DPX) in a certain region in the display unit 100. For example, the sensor pixel (SPX) is smaller than the adjacent display pixel (DPX) in a certain region in the display unit 100, and the sensor pixel (SPX) is bigger than the adjacent display pixel (DPX) in another certain region in the display unit 100.

Figure 10:
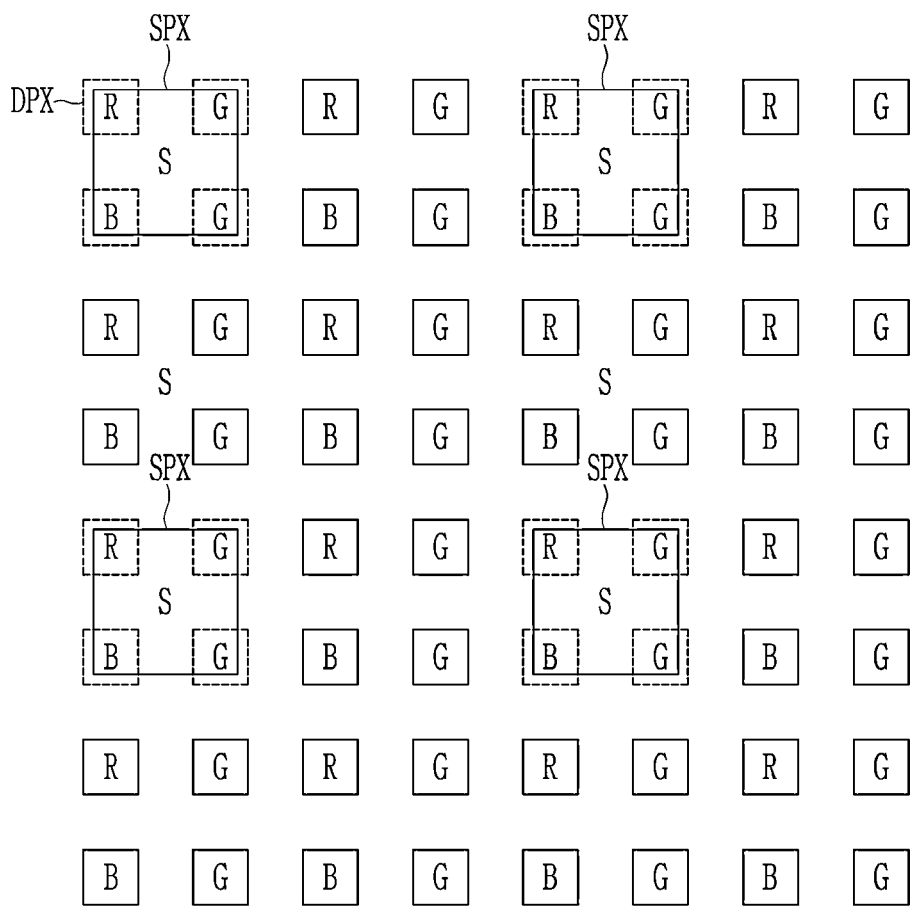

Referring to FIG. 10, one sensor pixel (SPX) may be positioned to replace four display pixels (DPX) in the region in which four display pixels (DPX) will be positioned. The display pixel (DPX) is not positioned in the region in which the sensor pixel (SPX) is positioned. In this instance, the sensor pixel (SPX) is bigger than the display pixel (DPX).

Further, a plurality of sensor pixels (SPX) may be positioned to replace the four display pixels (DPX) in the region in which four display pixels (DPX) will be positioned.

According to some example embodiments, the image sensor may acquire high-quality image signals, and the thin display device including the image sensor may be provided, so the space of the electronic device including the display device may be efficiently used as merits. Hence, new user experiences may be provided to the user.

As described herein, any devices, systems, blocks, modules, units, controllers, circuits, and/or portions thereof according to any of the example embodiments (including, without limitation, display device 10, display unit 100, drivers 110, 120, 130, 140, 150, and 160, signal controller 170, any portion thereof, or the like) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a graphics processing unit (GPU), an application processor (AP), a digital signal processor (DSP), a microcomputer, a field programmable gate array (FPGA), and programmable logic unit, a microprocessor, application-specific integrated circuit (ASIC), a neural network processing unit (NPU), an Electronic Control Unit (ECU), an Image Signal Processor (ISP), and the like. In some example embodiments, the processing circuitry may include a non-transitory computer readable storage device (e.g., a memory), for example a solid state drive (SSD), storing a program of instructions, and a processor (e.g., CPU) configured to execute the program of instructions to implement the functionality and/or methods performed by some or all of any devices, systems, blocks, modules, units, controllers, circuits, and/or portions thereof according to any of the example embodiments, and/or any portions thereof.

While this inventive concepts have been described in connection with what is presently considered to be practical example embodiments, it is to be understood that the inventive concepts are not limited to such example embodiments, but, on the contrary, are intended to cover various modifications and equivalent arrangements included within the spirit and scope of the appended claims.

What is claimed is:

1. A display device, comprising:
   a display unit including a plurality of display pixels and a plurality of sensor pixels;
   a plurality of drivers configured to apply signals to drive the plurality of display pixels and the plurality of sensor pixels; and
   a signal controller configured to control the plurality of drivers,
   wherein each separate pixel of the plurality of display pixels and the plurality of sensor pixels includes a separate plurality of transistors,
   wherein each separate plurality of transistors includes
      at least one transistor that includes a silicon semiconductor layer, and
      at least one other transistor that includes an oxide semiconductor layer,
   wherein the plurality of sensor pixels and the plurality of display pixels are arranged in a pattern in the display unit,
   wherein each of the plurality of display pixels displays one of red, blue, or green,
   wherein
      one sensor pixel is between two adjacent display pixels in the display unit in a first direction, the first direction extending perpendicular to first facing sidewalls of the two adjacent display pixels, such that the first facing sidewalls each extend in a second direction, the second direction perpendicular to the first direction,
      a first direction distance in the first direction between the first facing sidewalls of the two adjacent display pixels and through the one sensor pixel therebetween is less than a first direction length of one display pixel of the two adjacent display pixels in the first direction,
      the display unit does not include any sensor pixels between second facing sidewalls of two adjacent display pixels in the display unit in the second direction, the second facing sidewalls each extending in the first direction, and
   wherein in a planar view, the one sensor pixel is smaller in both the first direction, and the second direction than the two adjacent display pixels,
   wherein each display pixel includes
      a first display pixel transistor including a gate connected to a first node, a source connected to a second node, and a drain connected to a third node,
      a second display pixel transistor including a gate connected to a first scan line, a source connected to a data line, and a drain connected to the second node,
      a third display pixel transistor including a gate connected to a second scan line, and respective ends connected to the gate of the first display pixel transistor and the drain of the first display pixel transistor,
      a fourth display pixel transistor including a gate connected to a third scan line, a source connected to an initialization voltage supply line, and a drain connected to the first node,
      a fifth display pixel transistor including a gate connected to a light emission control line, a source connected to a supply line of a first power source voltage, and a drain connected to the second node,
      a sixth display pixel transistor including a gate connected to the light emission control line, a source connected to the third node, and a drain connected to an anode of an organic light emitting diode,
      a storage capacitor including one electrode connected to the first node and another electrode connected to the supply line of the first power source voltage, and
      a seventh display pixel transistor including a gate connected to a fourth scan line, a source connected to the anode of the organic light emitting diode, and a drain connected to the initialization voltage supply line,
   wherein at least one of the third display pixel transistor or the fourth display pixel transistor includes the oxide semiconductor layer,
   wherein the first, second, fifth, sixth, and seventh display pixel transistors include respective silicon semiconductor layers, and
   wherein
      the plurality of sensor pixels further include separate, respective organic photodiodes,
      the separate plurality of transistors included in each separate sensor pixel of the plurality of sensor pixels includes
         a first transistor connected to a cathode of the organic photodiode of the separate sensor pixel, a first driving voltage line, and a readout line, and
         a second transistor connected to a reset signal line, the first driving voltage line, and the cathode of the organic photodiode of the separate sensor pixel,
      wherein the first transistor includes the silicon semiconductor layer,
      wherein the second transistor includes the oxide semiconductor layer,
      wherein the second transistor includes a first gate electrode and a second gate electrode.

2. The display device of claim 1, wherein
   the separate plurality of transistors included in each separate sensor pixel of the plurality of sensor pixels includes
      the first transistor including a gate connected to the cathode of the organic photodiode of the separate sensor pixel, a drain connected to the first driving voltage line, and a source electrically connected to the readout line,
      a third transistor including a gate connected to a selection signal line, a drain connected to the source of the first transistor, and a source connected to the readout line, and
      the second transistor including a gate connected to the reset signal line, a drain connected to the first driving voltage line, and a source connected to the cathode of the organic photodiode of the separate sensor pixel, and the gate of the first transistor is configured to be reset in response to the second transistor being turned on.

3. The display device of claim 1, wherein a ratio of the plurality of sensor pixels versus the plurality of display pixels in the display unit is 1:1 to 1:2.

4. A display device, comprising:

a display unit including a plurality of display pixels and a plurality of sensor pixels;

a plurality of drivers configured to apply signals to drive the plurality of display pixels and the plurality of sensor pixels; and a signal controller configured to control the plurality of drivers, wherein each separate pixel of the plurality of display pixels and the plurality of sensor pixels includes a separate plurality of transistors, wherein each separate plurality of transistors includes
at least one transistor that includes a silicon semiconductor layer, and
at least one other transistor that includes an oxide semiconductor layer, wherein the plurality of sensor pixels and the plurality of display pixels are arranged in a pattern in the display unit, wherein each of the plurality of display pixels displays one of red, blue, or green, wherein
one sensor pixel is between two adjacent display pixels in the display unit in a first direction, the first direction extending perpendicular to first facing sidewalls of the two adjacent display pixels, such that the first facing sidewalls each extend in a second direction, the second direction perpendicular to the first direction,
a first direction distance in the first direction between the first facing sidewalls of the two adjacent display pixels and through the one sensor pixel therebetween is less than a first direction length of one display pixel of the two adjacent display pixels in the first direction,
the display unit does not include any sensor pixels between second facing sidewalls of two adjacent display pixels in the display unit in the second direction, the second facing sidewalls each extending in the first direction, and wherein in a planar view, the one sensor pixel is smaller in both the first direction and the second direction than the two adjacent display pixels, wherein each display pixel includes
a first display pixel transistor including a gate connected to a first node, a source connected to a second node, and a drain connected to a third node,
a second display pixel transistor including a gate connected to a first scan line, a source connected to a data line, and a drain connected to the second node,
a third display pixel transistor including a gate connected to a second scan line, and respective ends connected to the gate of the first display pixel transistor and the drain of the first display pixel transistor,
a fourth display pixel transistor including a gate connected to a third scan line, a source connected to an initialization voltage supply line, and a drain connected to the first node, a fifth display pixel transistor including a gate connected to a light emission control line, a source connected to a supply line of a first power source voltage, and a drain connected to the second node,
a sixth display pixel transistor including a gate connected to the light emission control line, a source connected to the third node, and a drain connected to an anode of an organic light emitting diode,
a storage capacitor including one electrode connected to the first node and another electrode connected to the supply line of the first power source voltage, and
a seventh display pixel transistor including a gate connected to a fourth scan line, a source connected to the anode of the organic light emitting diode, and a drain connected to the initialization voltage supply line, wherein at least one of the third display pixel transistor or the fourth display pixel transistor includes the oxide semiconductor layer, and wherein the first, second, fifth, sixth, and seventh display pixel transistors include respective silicon semiconductor layers, the plurality of sensor pixels further include separate, respective organic photodiodes, the separate plurality of transistors included in each separate sensor pixel of the plurality of sensor pixels includes
a first transistor including a gate connected to a cathode of the organic photodiode of the separate sensor pixel, a drain connected to a first driving voltage line, and a source electrically connected to a readout line,
a second transistor including a gate connected to a selection signal line, a drain connected to the source of the first transistor, and a source connected to the readout line,
a third transistor including a gate connected to a reset signal line, a drain connected to the first driving voltage line, and a source electrically connected to the cathode of the organic photodiode of the separate sensor pixel, and
a fourth transistor including a gate connected to a transmitting signal line, a drain connected to the gate of the first transistor, and a source connected to the cathode of the organic photodiode of the separate sensor pixel, and the gate of the first transistor is configured to be reset in response to the third transistor being turned on, wherein the first transistor includes the silicon semiconductor layer, and wherein the third transistor includes the oxide semiconductor layer.

5. A display device, comprising:

a display unit including a plurality of display pixels and a plurality of sensor pixels;

a plurality of drivers configured to apply signals to drive the plurality of display pixels and the plurality of sensor pixels; and a signal controller configured to control the plurality of drivers, wherein each separate pixel of the plurality of display pixels and the plurality of sensor pixels includes a separate plurality of transistors, wherein each separate plurality of transistors includes
at least one transistor that includes a silicon semiconductor layer, and
at least one other transistor that includes an oxide semiconductor layer, wherein the plurality of sensor pixels and the plurality of display pixels are arranged in a pattern in the display unit, wherein each of the plurality of display pixels displays one of red, blue, or green, wherein
one sensor pixel is between two adjacent display pixels in the display unit in a first direction, the first direction extending perpendicular to first facing sidewalls of the two adjacent display pixels, such that the first facing sidewalls each extend in a second direction, the second direction perpendicular to the first direction, a first direction distance in the first direction between the first facing sidewalls of the two adjacent display pixels and through the one sensor pixel therebetween is less than a first direction length of one display pixel of the two adjacent display pixels in the first direction, the display unit does not include any sensor pixels between second facing sidewalls of two adjacent display pixels in the display unit in the second direction, the second facing sidewalls each extending in the first direction, and wherein in a planar view, the one sensor pixel is smaller in both the first direction and the second direction than the two adjacent display pixels, wherein each display pixel includes
a first display pixel transistor including a gate connected to a first node, a source connected to a second node, and a drain connected to a third node, a second display pixel transistor including a gate connected to a first scan line, a source connected to a data line, and a drain connected to the second node, a third display pixel transistor including a gate connected to a second scan line, and respective ends connected to the gate of the first display pixel transistor and the drain of the first display pixel transistor, a fourth display pixel transistor including a gate connected to a third scan line, a source connected to an initialization voltage supply line, and a drain connected to the first node, a fifth display pixel transistor including a gate connected to a light emission control line, a source connected to a supply line of a first power source voltage, and a drain connected to the second node, a sixth display pixel transistor including a gate connected to the light emission control line, a source connected to the third node, and a drain connected to an anode of an organic light emitting diode, a storage capacitor including one electrode connected to the first node and another electrode connected to the supply line of the first power source voltage, and a seventh display pixel transistor including a gate connected to a fourth scan line, a source connected to the anode of the organic light emitting diode, and a drain connected to the initialization voltage supply line, wherein at least one of the third display pixel transistor or the fourth display pixel transistor includes the oxide semiconductor layer, and wherein the first, second, fifth, sixth, and seventh display pixel transistors include respective silicon semiconductor layers, wherein each separate sensor pixel of the plurality of sensor pixels further includes a separate plurality of organic photodiodes configured to convert incident light with different wavelengths into electrical signals, wherein the separate plurality of transistors included in each separate sensor pixel of the plurality of sensor pixels includes
a first transistor including a gate connected to respective cathodes of the separate plurality of organic photodiodes of the separate sensor pixel, a drain connected to a first driving voltage line, and a source electrically connected to a readout line, a second transistor including a gate connected to a selection signal line, a drain connected to the source of the first transistor, and a source connected to the readout line, a third transistor including a gate connected to a reset signal line, a drain connected to the first driving voltage line, and a source electrically connected to the respective cathodes of the separate plurality of organic photodiodes of the separate sensor pixel, a fourth-1 transistor including a gate connected to a first transmitting signal line, a drain connected to the gate of the first transistor, and a source connected to a cathode of a first organic photodiode of the separate plurality of organic photodiodes of the separate sensor pixel, a fourth-2 transistor including a gate connected to the first transmitting signal line, a drain connected to the gate of the first transistor, and a source connected to a cathode of a second organic photodiode of the separate plurality of organic photodiodes of the separate sensor pixel, and a fourth-3 transistor including a gate connected to the first transmitting signal line, a drain connected to the gate of the first transistor, and a source connected to a cathode of a third organic photodiode of the separate plurality of organic photodiodes of the separate sensor pixel, and the gate of the first transistor is configured to be reset in response to the third transistor being turned on, wherein the first transistor includes the silicon semiconductor layer, and wherein the third transistor includes the oxide semiconductor layer.

6. A display device, comprising:
a display unit including a plurality of display pixels and a plurality of sensor pixels;

a plurality of drivers configured to apply signals to drive the plurality of display pixels and the plurality of sensor pixels; and a signal controller configured to control the plurality of drivers, wherein each separate pixel of the plurality of display pixels and the plurality of sensor pixels includes a separate plurality of transistors, wherein each separate plurality of transistors includes
at least one transistor that includes a silicon semiconductor layer, and
at least one other transistor that includes an oxide semiconductor layer, wherein the plurality of sensor pixels and the plurality of display pixels are arranged in a pattern in the display unit, wherein each of the plurality of display pixels displays one of red, blue, or green, wherein the pattern of the plurality of sensor pixels and the plurality of display pixels includes
an array of display pixel positions, one sensor pixel in place of at least one of the display pixel positions in the array, and display pixels in remaining display pixel positions of the display pixel positions, wherein each display pixel includes a first display pixel transistor including a gate connected to a first node, a source connected to a second node, and a drain connected to a third node, a second display pixel transistor including a gate connected to a first scan line, a source connected to a data line, and a drain connected to the second node, a third display pixel transistor including a gate connected to a second scan line, and respective ends connected to the gate of the first display pixel transistor and the drain of the first display pixel transistor, a fourth display pixel transistor including a gate connected to a third scan line, a source connected to an initialization voltage supply line, and a drain connected to the first node, a fifth display pixel transistor including a gate connected to a light emission control line, a source connected to a supply line of a first power source voltage, and a drain connected to the second node, a sixth display pixel transistor including a gate connected to the light emission control line, a source connected to the third node, and a drain connected to an anode of an organic light emitting diode, a storage capacitor including one electrode connected to the first node and another electrode connected to the supply line of the first power source voltage, and a seventh display pixel transistor including a gate connected to a fourth scan line, a source connected to the anode of the organic light emitting diode, and a drain connected to the initialization voltage supply line, wherein at least one of the third display pixel transistor or the fourth display pixel transistor includes the oxide semiconductor layer, and wherein the first, second, fifth, sixth, and seventh display pixel transistors include respective silicon semiconductor layers, wherein the plurality of sensor pixels further include separate, respective organic photodiodes, wherein the separate plurality of transistors included in each separate sensor pixel of the plurality of sensor pixels includes a first transistor connected to a cathode of the organic photodiode of the separate sensor pixel, a first driving voltage line, and a readout line, and a second transistor connected to a reset line, the first driving voltage line, and the cathode of the organic photodiode of the separate sensor pixel, wherein the first transistor includes the silicon semiconductor layer, and wherein the second transistor includes the oxide semiconductor layer, and the second transistor includes a first gate electrode and a second gate electrode.

7. The display device of claim 6, wherein
The one sensor pixel is in place of four adjacent display pixel positions in the pattern.

8. The display device of claim 6, wherein
the separate plurality of transistors included in each separate sensor pixel of the plurality of sensor pixels includes the first transistor including a gate connected to the cathode of the organic photodiode of the separate sensor pixel, a drain connected to the first driving voltage line, and a source electrically connected to the readout line, a third transistor including a gate connected to a selection signal line, a drain connected to the source of the first transistor, and a source connected to the readout line, and the second-transistor including a gate connected to the reset signal line, a drain connected to the first driving voltage line, and a source connected to the cathode of the organic photodiode of the separate sensor pixel, and wherein the gate of the first transistor is configured to be reset in response to the third transistor being turned on.

* * * * *